United States Patent
Saitou et al.

(10) Patent No.: US 9,885,114 B2
(45) Date of Patent: Feb. 6, 2018

(54) FILM FORMING APPARATUS

(71) Applicant: Tokyo Electron Limited, Tokyo (JP)

(72) Inventors: Tetsuya Saitou, Nirasaki (JP); Tomohiro Oota, Nirasaki (JP); Toshio Takagi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 183 days.

(21) Appl. No.: 14/659,121

(22) Filed: Mar. 16, 2015

(65) Prior Publication Data
US 2015/0267298 A1 Sep. 24, 2015

(30) Foreign Application Priority Data
Mar. 18, 2014 (JP) .................. 2014-055146

(51) Int. Cl.
| | |
|---|---|
| C23F 1/00 | (2006.01) |
| H01L 21/306 | (2006.01) |
| C23C 16/455 | (2006.01) |
| C23C 16/34 | (2006.01) |
| C23C 16/44 | (2006.01) |
| C23C 16/458 | (2006.01) |
| C23C 16/46 | (2006.01) |

(52) U.S. Cl.
CPC ........ *C23C 16/45565* (2013.01); *C23C 16/34* (2013.01); *C23C 16/45544* (2013.01); *C23C 16/45574* (2013.01); *C23C 16/4412* (2013.01); *C23C 16/458* (2013.01); *C23C 16/46* (2013.01)

(58) Field of Classification Search
CPC ................................. C23C 16/45565
USPC ........................ 156/345.33, 345.34
See application file for complete search history.

(56) References Cited

U.S. PATENT DOCUMENTS

| | | | | |
|---|---|---|---|---|
| 3,854,443 A | * | 12/1974 | Baerg ............. | C23C 16/455 118/724 |
| 5,284,805 A | * | 2/1994 | Geyling ........... | C23C 16/455 29/25.01 |
| 5,320,982 A | * | 6/1994 | Tsubone .......... | C23C 14/50 118/724 |
| 5,328,585 A | * | 7/1994 | Stevenson ....... | H01J 37/3408 204/192.12 |

(Continued)

FOREIGN PATENT DOCUMENTS

| | | |
|---|---|---|
| JP | H11-297681 A | 10/1999 |
| JP | 2000-077337 A | 3/2000 |

(Continued)

*Primary Examiner* — Keath T Chen

(57) ABSTRACT

A film forming apparatus for performing a film forming process by sequentially supplying a plurality of reactant gases to a substrate and supplying a replacement gas includes a mounting table configured to mount thereon a substrate, and a shower head having a flat surface facing the mounting table and a plurality of gas supply opening. An annular protrusion is provided at the shower head to form a gap between the annular protrusion and a top surface of the mounting table. A plurality of gas supply units is provided at a ceiling portion at an upper side of the shower head. Each gas supply unit has gas discharge openings formed along a circumferential direction. The diffusion space is disposed such that an outer periphery of the diffusion space is located at an inner side of an outer periphery of the substrate mounted on the mounting table in a plan view.

17 Claims, 11 Drawing Sheets

(56) References Cited

U.S. PATENT DOCUMENTS

| | | | | |
|---|---|---|---|---|
| 5,370,739 | A * | 12/1994 | Foster | C23C 16/4412 118/720 |
| 5,431,738 | A * | 7/1995 | Murakami | C23C 16/45561 118/715 |
| 5,486,975 | A * | 1/1996 | Shamouilian | H01L 21/6831 361/230 |
| 5,565,382 | A * | 10/1996 | Tseng | C23C 16/42 118/715 |
| 5,740,009 | A * | 4/1998 | Pu | H01L 21/6831 361/234 |
| 2005/0269292 | A1 * | 12/2005 | Koshiishi | H01J 37/32027 216/67 |
| 2006/0086319 | A1 * | 4/2006 | Kasai | C23C 16/16 118/715 |
| 2007/0202701 | A1 * | 8/2007 | Nakaya | H01L 21/32137 438/689 |
| 2009/0178614 | A1 | 7/2009 | Kasai et al. | |
| 2009/0194235 | A1 * | 8/2009 | Kobayashi | H01J 37/32082 156/345.28 |
| 2010/0133234 | A1 * | 6/2010 | Yoshida | H01J 37/32091 216/67 |
| 2010/0279008 | A1 * | 11/2010 | Takagi | C23C 16/409 427/248.1 |
| 2010/0310772 | A1 | 12/2010 | Tsuda | |
| 2011/0186229 | A1 * | 8/2011 | Hayashi | B05B 1/18 156/345.34 |
| 2011/0226181 | A1 * | 9/2011 | Yamamoto | C23C 16/16 118/724 |

FOREIGN PATENT DOCUMENTS

| | | |
|---|---|---|
| JP | 2002-327274 | 11/2002 |
| JP | 2006-299294 | 11/2006 |
| JP | 2009-224775 | 1/2009 |
| KR | 10-2008-0112437 A | 12/2008 |
| KR | 10-2010-0124198 A | 11/2010 |

* cited by examiner

TEST EXAMPLE 4-1

REFERENCE EXAMPLE 4-1

FILM FORMING APPARATUS

CROSS-REFERENCE TO RELATED APPLICATIONS

This application claims priority to Japanese Patent Application No. 2014-055146 filed on Mar. 18, 2014, the entire contents of which are incorporated herein by reference.

FIELD OF THE INVENTION

The present invention relates to a film forming apparatus for forming a film by sequentially supplying a plurality of reactant gases that react with one another to a substrate.

BACKGROUND OF THE INVENTION

As for a method for forming a film on a substrate, e.g., a semiconductor wafer (hereinafter, referred to as "wafer"), there are known a so-called ALD (Atomic Layer Deposition) method for sequentially supplying a plurality of reactant gases that react with one another to a wafer, and a MLD (Multi Layer Deposition) method (hereinafter, both will be referred to as "ALD method").

There are suggested various gas supply units for supplying reactant gases to a wafer in such a film forming method. For example, Japanese Patent Application Publication Nos. 2002-327274 and 2006-299294 disclose a shower head including vertically arranged gas diffusion spaces (referred to as "spaces 11a and 11b" in JP2002-327274A and "a gas diffusion space 50 and a space 81" in JP2006-299294A) partitioned by an intermediate plate among a plurality of plates provided at multiple stages spaced apart from each other in a vertical direction, and a plurality of gas channels extending from the respective diffusion spaces to a bottom surface of a lowermost shower plate.

In such a shower head, reactant gases are respectively supplied from the gas diffusion spaces separated from each other. Therefore, the reactant gases are not mixed with each other in the gas diffusion spaces, thereby preventing deposition of reaction products to the shower head.

In order to supply the reactant gases from the vertically arranged gas diffusion spaces without being mixed with each other, it is required to provide a plurality of lines for gas channels which penetrate through the lower gas diffusion space to communicate with the upper gas diffusion space. This makes the structure of the shower head complicated.

Therefore, there has been developed a simple shower head for selectively supplying a plurality of reactant gases into a common gas diffusion space. In the case of using the common gas diffusion space, gas replacement needs to be performed by supplying an inert gas or the like between supply of a reactant gas and supply of a next reactant gas in order to prevent deposition of reaction products.

When the reactant gases are replaced, time required for the replacement operation needs to be minimized in order to efficiently perform film formation. Recently, a deposited film of nanometer order may require film thickness uniformity (e.g., 10% to be described later (percentage of standard deviation σ divided by an average value)) of 2% or less over the wafer surface. Therefore, it is required to develop a shower head capable of realizing film formation with excellent in-plane uniformity as well as effective replacement.

In response to such demands, the shower head disclosed in Patent Documents 1 and 2 has a large gas diffusion space extending over a region corresponding to the entire surface of the wafer. Even if reactant gases and a replacement gas are selectively supplied to one side of the gas diffusion space, a long period of time is required for the replacement operation.

Further, JP2002-327274A and JP2006-299294A disclose gas supply units for supplying reactant gases into the gas diffusion spaces (gas injection openings 121 formed at a pipe portion 10j in JP2002-327274A, and a gas injection port 56 having a gas injection opening 55 and a gas injection line 83 in JP2006-299294A). However, in the shower head for selectively supplying the reactant gases and the replacement gas, there is no description on technical features of the gas supply units which are required to improve uniformity of a film to be formed.

Therefore, there has been developed a film forming apparatus disclosed in Japanese Patent Application Publication No. 2009-224775 which increases efficiency of replacement by providing a shower head (referred to as "gas supply nozzle" in JP2009-224775A) smaller than a wafer as a film formation target at a central area of a ceiling portion having an inclined surface that becomes gradually wider from a central side toward a peripheral side.

However, a flow speed of a reactant gas injected from a gas supply opening formed immediately below a gas supply line for introducing a gas into the shower head among a plurality of gas supply openings formed at the shower head may be increased compared to that of a reactant gas injected from a gas supply opening formed at a position separated from the position immediately below the gas supply line. As a result, a difference in flow speeds of the gases injected from the gas supply openings leads to a difference in the amount of reactant gases adsorbed onto the wafer and the film thickness may be slightly varied in the surface of the wafer. However, if high in-plane uniformity (1σ%) of about 2% or less is required as described above, even a slight difference in the film thickness needs to be improved.

SUMMARY OF THE INVENTION

In view of the above, the present invention provides a film forming apparatus capable of forming a film having high in-plane uniformity and ensuring effective replacement between reactant gases and a replacement gas.

In accordance with an aspect of the present invention, there is provided a film forming apparatus for performing a film forming process by sequentially supplying a plurality of reactant gases that react with one another to a substrate in a processing chamber in a vacuum atmosphere and supplying a replacement gas between supply of one reactant gas and supply of a next reactant gas. The film forming apparatus includes a mounting table provided in the processing chamber, and configured to mount thereon a substrate; a shower head configured to have a flat surface facing the mounting table, and a plurality of gas supply opening; an annular protrusion provided at the shower head so as to protrude downward and surround a region where the gas supply openings are formed, and configured to form a gap between the annular protrusion and a top surface of the mounting table at an outer side of a substrate mounting region of the mounting table; a plurality of gas supply units provided at a ceiling portion above the shower head, and configured to have gas discharge openings formed along a circumferential direction to allow a gas to be horizontally diffused to a diffusion space surrounded by the shower head and the ceiling portion; and a gas exhaust unit configured to evacuate the processing chamber. Further, an outer periphery of the diffusion space is located at an inner side of an outer periphery of the substrate mounted on the mounting table.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, an embodiment of the present invention will be described with reference to the accompanying drawings.

A configuration of a film forming apparatus in accordance with an embodiment of the present invention will be described with reference to FIGS. 1 to 6. The film forming apparatus is for forming a titanium nitride film (TiN film) by an ALD method for alternately supplying titanium chloride ($TiCl_4$) gas (source gas) and an ammonia ($NH_3$) gas (nitriding gas) as reactant gases that react with each other to a surface of a circular substrate as a film formation target, e.g., a wafer W having a diameter of 300 mm.

Figure 1:
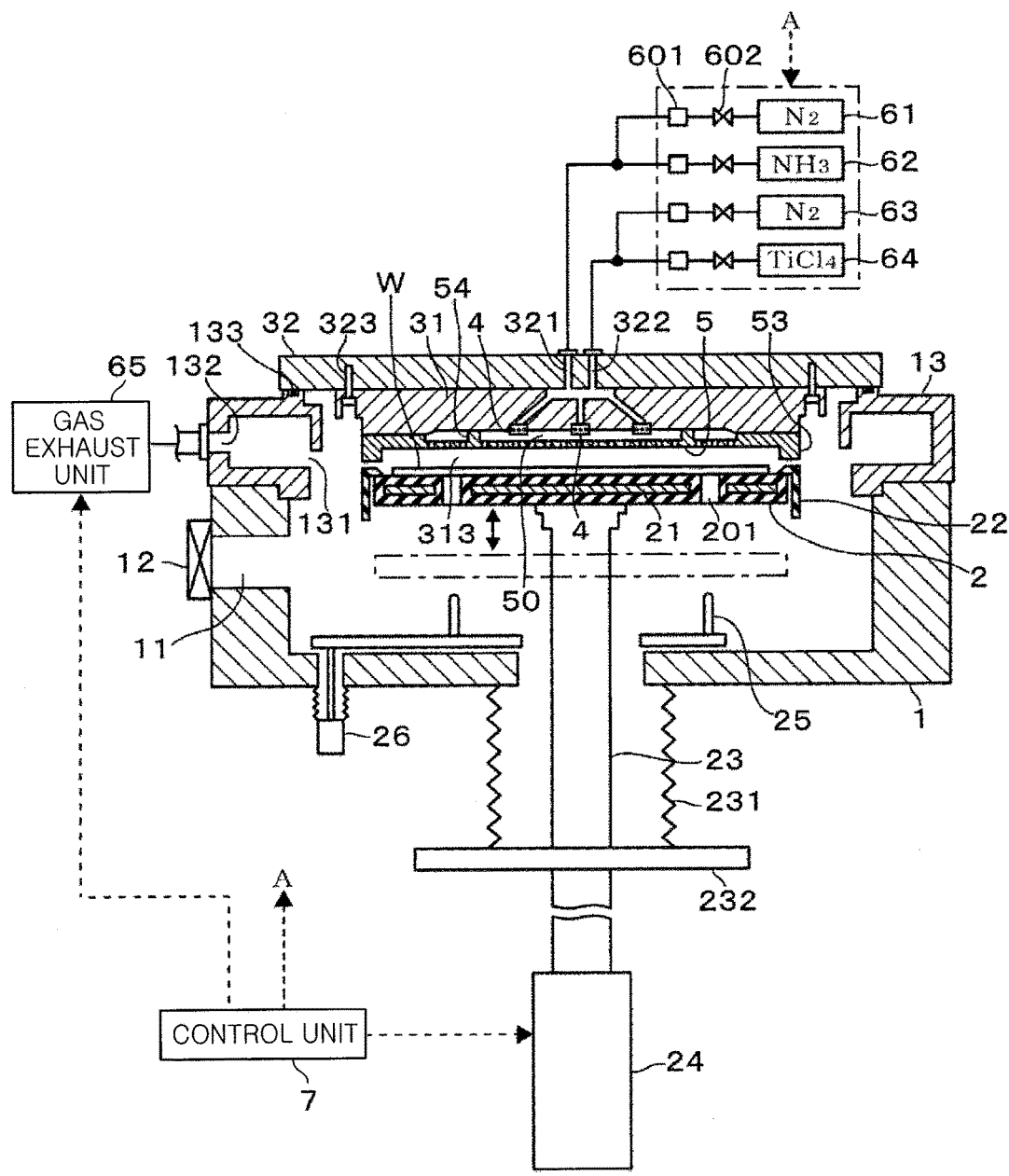
FIG. 1 is a vertical cross sectional view of a film forming apparatus in accordance with an embodiment of the present invention.
Figure 2:
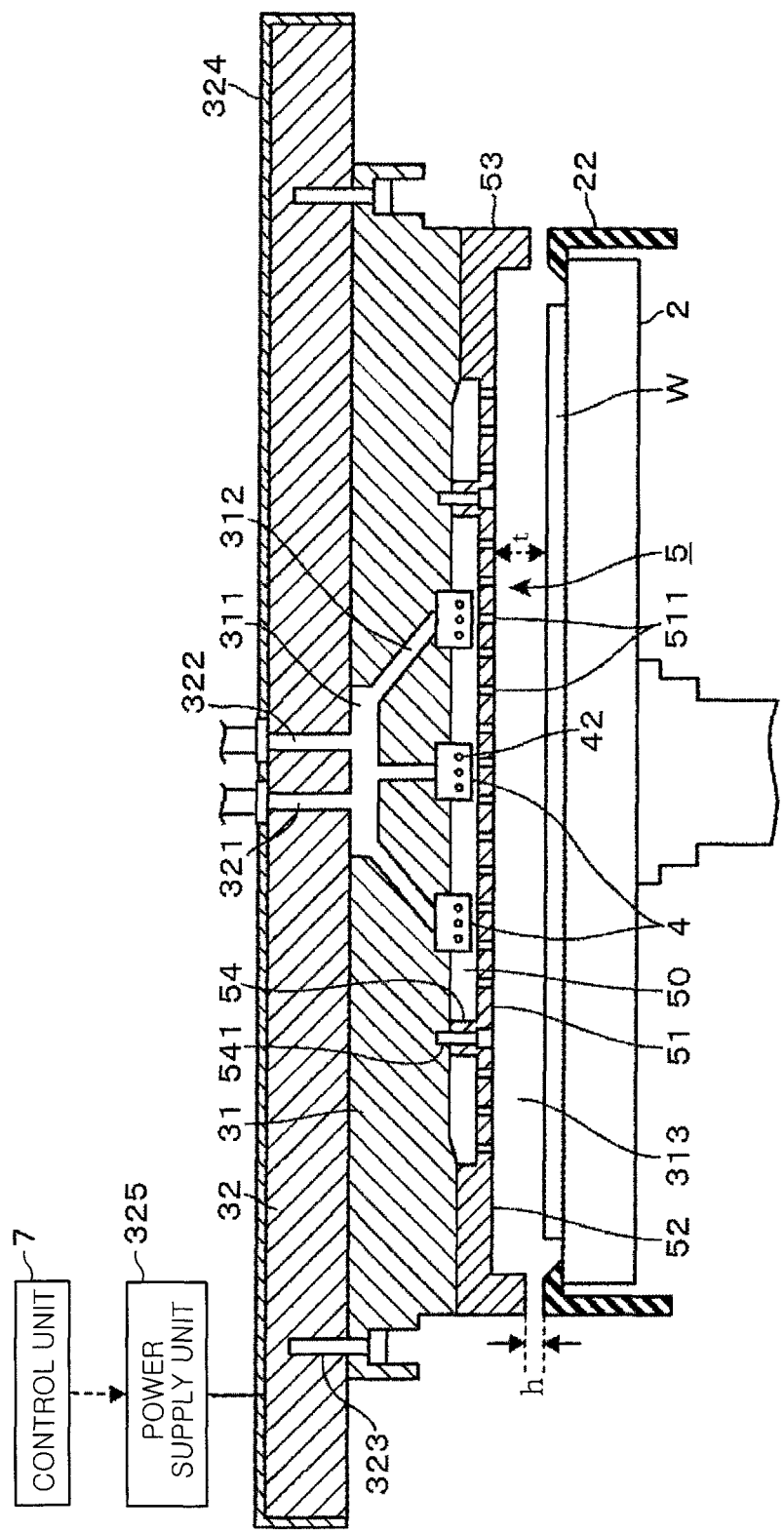
FIG. 2 is a partially enlarged vertical cross sectional view of the film forming apparatus.

As shown in FIGS. 1 and 2, the film forming apparatus includes: a processing chamber 1 that is a vacuum container made of metal such as aluminum or the like and having an approximately circular shape in a plan view; a mounting table (mounting portion) 2, provided in the processing chamber 1, for mounting thereon the wafer W; and a gas shower head 5 disposed to face the mounting table 2 such that a processing space 313 is formed between the gas shower head 5 and the mounting table 2, the gas shower head 5 serving to supply a gas to the processing space 313. Formed at a sidewall of the processing chamber are a loading/unloading port 11 for allowing a wafer transfer unit provided at an external vacuum transfer chamber to be loaded into and unloaded from the processing chamber 1 during transfer of the wafer W to and from the mounting table 2 and a gate valve 12 for opening/closing the loading/unloading port 11.

A gas exhaust duct 13, which is made of metal such as aluminum or the like and formed by bending a duct having a quadrilateral vertical cross section into a circular ring shape, is provided at a position above the loading/unloading port 11 to be arranged on a sidewall forming a main body of the processing chamber 1. A slit shaped opening 131 extending along the circumferential direction is formed at an inner peripheral surface of the gas exhaust duct 13. A gas flowing out of the processing space 313 is exhausted into the gas exhaust duct 13 through the opening 131. A gas exhaust port 132 is formed at an outer wall surface of the gas exhaust duct 13. A gas exhaust unit 65 including a vacuum pump or the like is connected to the gas exhaust port 132. The gas exhaust port 132 and the gas exhaust unit 65 correspond to a gas exhaust mechanism for performing vacuum evacuation of the processing space 313.

In the processing chamber 1, the mounting table 2 is provided at an inner side of the gas exhaust duct 13. The mounting table 2 is a circular plate greater than the wafer W and made of, e.g., ceramic such as aluminum nitride (AlN), quartz glass ($SiO_2$) or the like, or metal such as aluminum (Al), Hastelloy® or the like. A heater 21 is buried in the mounting table 2 to heat the wafer W to a film forming temperature of, e.g., about 350° C. to 550° C. If necessary, there may be provided an electrostatic chuck (not shown) for fixing the wafer W into a mounting region provided at a top surface of the mounting table 2. The heater 21 is not illustrated in the drawings other than the vertical cross sectional view of FIG. 1.

A cover member 22 is provided at the mounting table 2 to cover the outer peripheral region of the mounting region and the side peripheral surface of the mounting table 2 in the circumferential direction. The cover member 22 is made of, e.g., alumina or the like, and has an approximately cylindrical shape having upper and lower ends opened. An upper end portion of the cover member 22 is inwardly bent in a horizontal direction along the circumferential direction. The bent portion is fixed to the peripheral portion of the mounting table 2. A thickness of the bent portion is greater than the thickness (about 0.8 mm) of the wafer W and is within a range from about 1 mm to 5 mm, preferably about 3 mm, for example.

A supporting member 23 extending through the bottom surface of the processing chamber 1 in a vertical direction is connected to a central portion of the bottom surface of the mounting table 2. A lower end portion of the supporting member 23 is connected to an elevation unit 24 via a plate-shaped support 232 disposed horizontally below the processing chamber 1. The elevation unit 24 vertically moves the mounting table 2 between a transfer position (indicated by a dashed dotted line in FIG. 1) where the wafer W is transferred between the mounting table 2 and the wafer transfer unit through the loading/unloading port 11 and a processing position, above the transfer position, where the film formation is performed on the wafer W.

A bellows 231 that is extended/contracted by the vertical movement of the support 232 is provided between the support 232 and the bottom surface of the processing chamber 1 through which the supporting member 23 penetrates to cover the supporting member 23 at the outer side thereof in the circumferential direction. The bellows 231 isolates the atmosphere in the processing chamber from the outside.

Provided below the mounting table 2 are, e.g., three supporting pins 25 for supporting and raising the wafer W from the bottom surface side thereof during the transfer of the wafer W between the mounting table 2 and the wafer transfer unit. The supporting pins 25 are connected to the elevation unit 26 and vertically movable. The wafer W is transferred between the mounting table 2 and the wafer transfer unit by protrusion and retraction of the supporting pins 25 above and below the top surface of the mounting table 2 through the through holes 201 penetrating through the mounting table 2 in a vertical direction.

A circular holding plate 32 is provided at a top surface of the gas exhaust duct 13 to cover a circular opening. An O-ring 133 for airtightly sealing the processing chamber 1 is provided between the gas exhaust duct 13 and the holding plate 32. A ceiling plate 31 for supplying reactant gases or a replacement gas into the processing space 313 is provided at the bottom surface side of the holding plate 32. The ceiling plate 31 is fixed to the holding plate 32 by bolts 323. The ceiling plate 31 or the holding plate 32 forms a ceiling portion of the film forming apparatus.

As shown in FIG. 2, a heater 324 connected to a power supply unit 325 is provided at a top surface of the holding plate 32 to control a temperature of the ceiling plate 31 or a temperature of a shower head 5 to be described later. The heater 324 corresponds to a temperature control unit for controlling a temperature of the holding plate 32 or a temperature of the shower head 5 to be described later via the ceiling plate 31. The heater 324 and the power supply unit 325 are not illustrated in the drawings other than FIG. 2.

A recess is formed at the bottom surface of the ceiling plate 31. The recess has a flat central region. A peripheral flat surface is formed at an outer peripheral side of the flat central region, the peripheral lat surface protruding downward from the flat central region.

The shower head 5 is provided below the ceiling plate 31 to cover the entire bottom surface of the ceiling plate 31. The shower head 5 includes: a circular plate made of, e.g., metal, and having a flat surface facing the mounting table 2; and an annular protrusion 53 protruding downward and formed at a peripheral portion of the circular plate. The shower head 5 has a recess formed at a top surface thereof. A flat surface protruding upward is formed at a peripheral side of the recess in the shower head 5.

Figure 3:
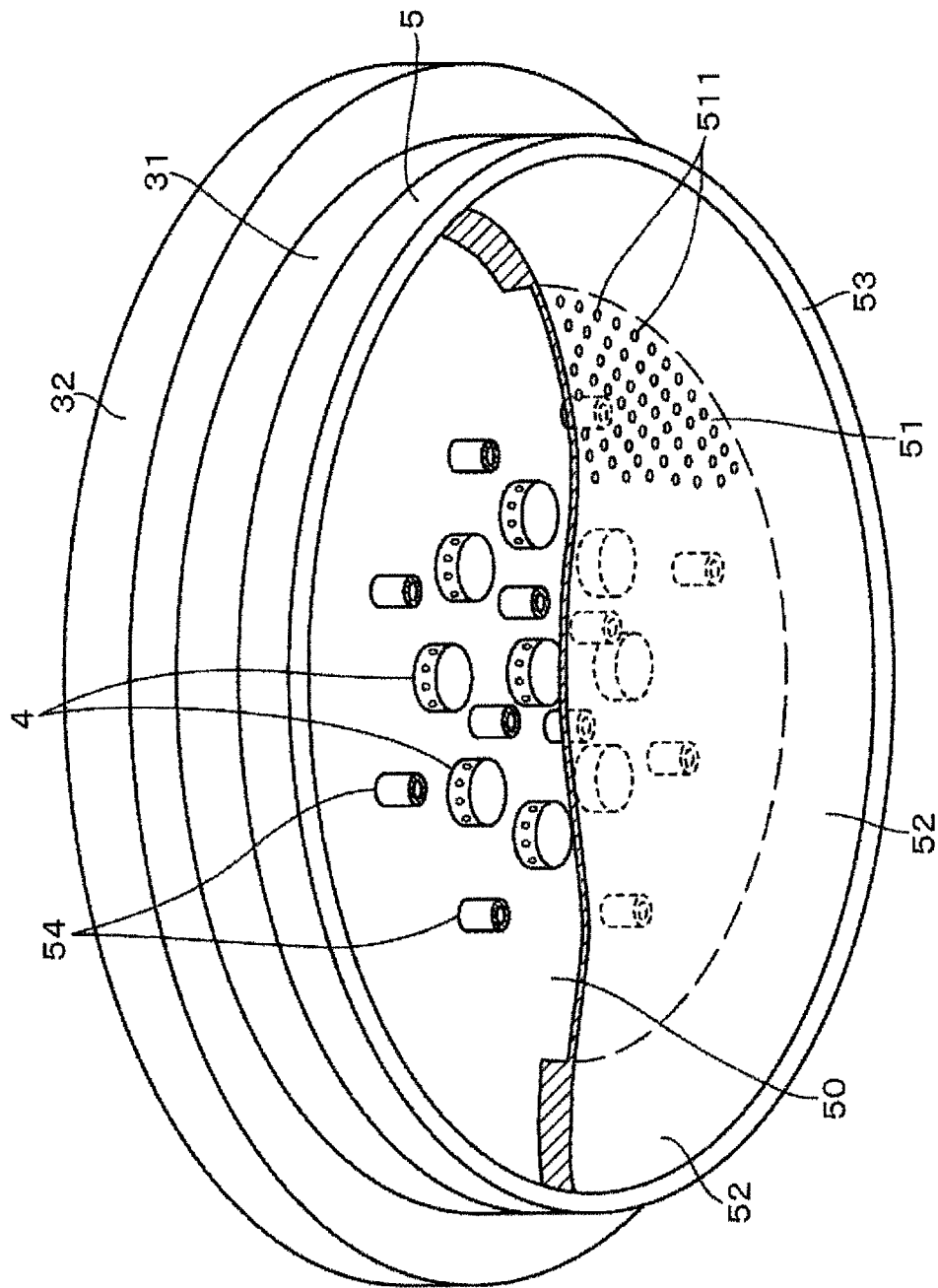
FIG. 3 is a perspective view of a ceiling plate provided at the film forming apparatus.

The ceiling plate 31 and the shower head 5 are fastened by bringing the flat bottom surface of the ceiling plate 31 and the flat top surface of the shower head 5 into contact with each other. A gas diffusion space 50 where a gas is diffused is formed by allowing recesses formed at inner sides of the contact surfaces to face with each other. A plurality of gas supply openings 511 is formed over the entire bottom surface of the gas diffusion space 50, so that reactant gases can be supplied toward the wafer W. Hereinafter, in the shower head 5, a region below the gas diffusion space 50 where the gas supply openings 511 are formed will be referred to as a gas supply region 51, and a region where the gas supply openings 511 are not formed which is disposed at the outer side of the gas diffusion space 50 will be referred to as a peripheral region 52. In FIG. 3, a boundary between the gas supply region 51 and the peripheral region 52 is indicated by a long dashed line.

In the shower head 5 of the present embodiment, a diameter of the gas diffusion space 50 (i.e., a diameter of the gas supply region 51) is set to about 255 mm (a radius of 127.5 mm); a height of the gas diffusion space 50 is set to about 8 mm; and a volume of the shower head 5 except a volume of a gas supply unit 4 to be described later is set to about 385 cm$^3$.

When the shower head 5 having the gas diffusion space 50 having a diameter of about 255 mm (radius of about 127.5 mm) is disposed above the central portion of the wafer W having a diameter of 300 mm (radius of 150 mm) which is mounted on the mounting table 2, the outer periphery of the gas diffusion space 50 is located at an inner side of the outer periphery of the wafer W. By using the shower head 5 having the gas diffusion space 50 smaller than the wafer W when seen from the bottom surface side, the replacement of the reactant gases by the replacement gas can be performed in a short period of time.

Figure 6:
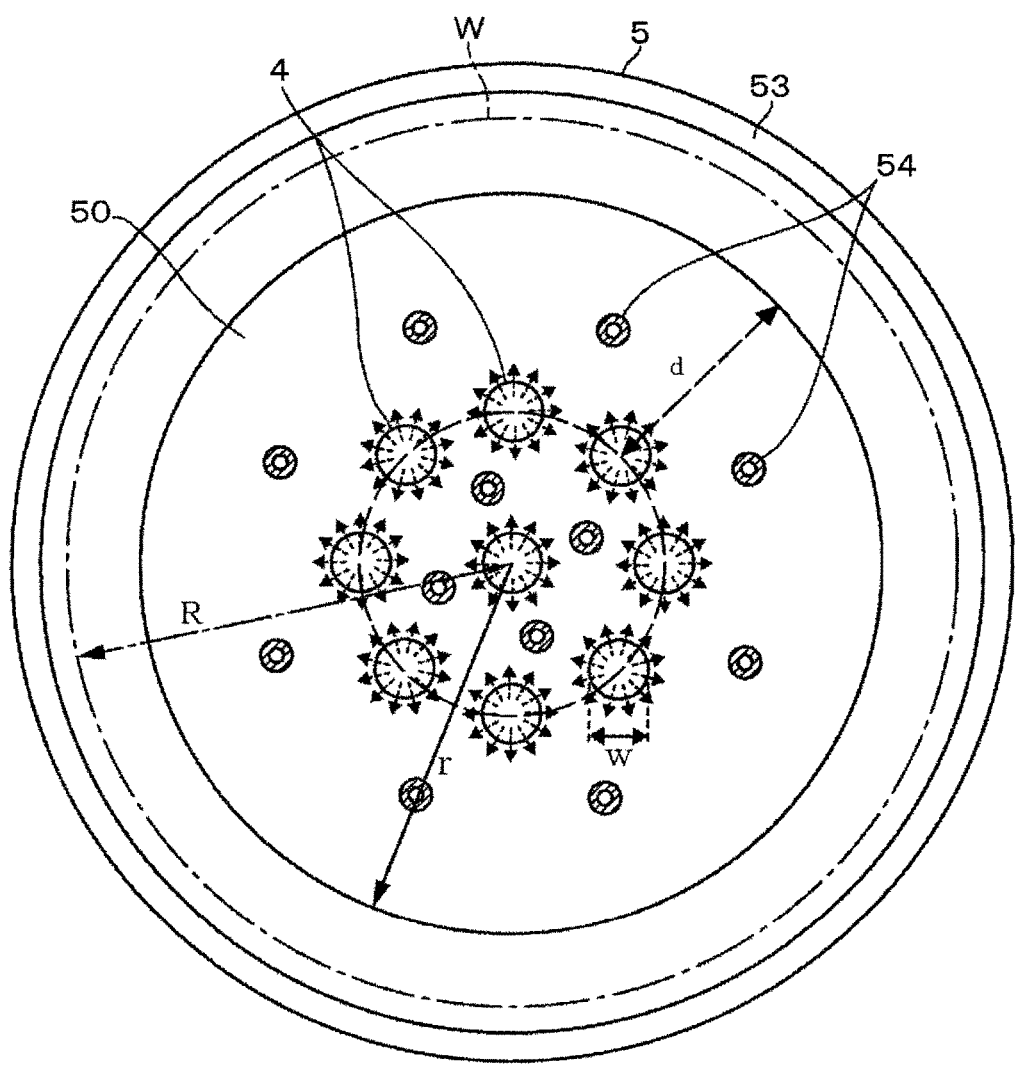
FIG. 6 is a top view of a shower head which shows arrangement of gas supply units.

FIG. 6 shows the shower head 5 in which the gas supply region 51 is omitted which is seen from the bottom surface side. As shown in FIG. 6, when the gas diffusion space 50 has a circular shape seen from the top, on the assumption that a radius of the gas diffusion space 50 is r and a radius of the wafer W is R, a value of r/R is preferably in the range of 4/15 to 9/10. Further, the height of the gas diffusion space 50 is preferably within a range from about 3 mm to 10 mm. The volume in the gas diffusion space 50 is preferably within a range from about 150 cm$^3$ to 400 cm$^3$. By supplying the replacement gas of an amount that is 5 to 22 times greater than the above volume at a flow rate of about 2 L/min to 8.8 L/min into the gas diffusion space 50, the replacement operation can be completed in about 0.1 sec to 0.5 sec.

It is not necessary to provide the gas supply openings 511 over the entire bottom surface of the gas diffusion space 50. For example, the gas supply openings 511 may be formed only at the central region of the bottom surface of the gas diffusion space 50 as long as the time for replacing the gas in the shower head 5 and the uniformity of the film formed on the wafer W are satisfied. The gas supply openings 511 may open at the outer side of the gas diffusion space 50 by using as the gas supply openings 511 ends of flow channels horizontally extending outward in a member provided at the bottom surface side of the shower head 5. In FIG. 3, only a part of the gas supply openings 511 formed at the gas supply region 51 is illustrated for convenience.

The height t from the top surface of the wafer W on the mounting table 2 to the gas supply openings 511 in the gas supply region 51 is set to about 10 mm to 50 mm and more preferably set to about 15 mm to 20 mm. If the height exceeds about 50 mm, the gas replacement efficiency is decreased. If the height becomes smaller than about 10 mm, a space for the gas supply unit 4 or the shower head 5 does not exist or it is difficult for the gas to flow in the processing space 313. Since the bottom surface of the shower head 5 is flat as described above, the shower head 5 is separated by a uniform distance from the top surface of the wafer W mounted on the mounting table 2.

As shown in FIG. 3, the circular ring-shaped peripheral region 52 where the gas supply openings 511 are not formed is provided around the gas supply region 51 where the gas supply openings 511 are formed. The gas supply region 51 and the peripheral region 52 are formed as one unit. Further, an annular protrusion 53 protruding downward is formed at the peripheral portion of the shower head 5 along the circumferential direction of the shower head 5.

When the mounting table 2 is raised to the processing position, the lower end of the annular protrusion 53 is disposed to face the top surface of the cover member 22 provided at the mounting table 2. The space surrounded by the bottom surface of the shower head 5, the annular protrusion 53, and the top surface of the mounting table 2 becomes the processing space 313 where film formation is performed on the wafer W.

As shown in FIG. 2, a height of the processing position is set such that a gap having a height h is formed between the lower end of the annular protrusion 53 and the top surface of the bent portion of the cover member 22. The opening 131 of the gas exhaust duct 13 opens toward the gap. The height h of the gap between the lower end of the annular protrusion 53 and the cover member 22 is set within a range from about 0.2 mm to 10.0 mm, preferably about 3.0 mm, for example.

As shown in FIGS. 1 and 2, a plurality of cylindrical heat transfer members 54 is provided at the top surface of the shower head 5 inside the gas diffusion space 50 to protrude upward. Each of the heat transfer members 54 has a screw hole penetrating therethrough in a vertical direction. Further, screw holes are formed at positions of the ceiling plate 31 which correspond to the heat transfer members 54. By driving screws 541 into the screw holes, the shower head 5 is fastened to the ceiling plate 31.

When the shower head 5 is fastened to the ceiling plate 31, the upper ends of the heat transfer members 54 are in contact with the bottom surface of the ceiling plate 31. As a result, the heat supplied from the heater 324 and transferred via the holding plate 32 and the ceiling plate 31 is easily transferred to the bottom surface of the shower head 5 via the heat transfer members 54 and the screws 541. The heat transfer members 54 correspond to heat transfer members that connect the shower head 5 and the ceiling plate 31 to facilitate heat transfer among the shower head 5, the ceiling plate 31, and the holding plate 32.

As shown in FIGS. 3 and 6, in the shower head 5 of the present embodiment, the heat transfer members 54 are arranged in two concentric circular shapes about the center of the gas diffusion space 50 and spaced apart from each other at a regular interval in a circumferential direction of each circle. Twelve heat transfer members 54 are provided in total. Among them, four heat transfer members are arranged at a central side and eight heat transfer members are arranged at a peripheral side. The number and the arrangement of the heat transfer members 54 provided at the shower head 5 are not limited to those of the present embodiment and may be properly changed when the temperature of the shower head 5 needs to be controlled.

As shown in FIGS. 3 and 6, nine gas supply units 4 are provided in the gas diffusion space 50. One gas supply unit 4 is provided at a central portion of the recess and eight gas supply units 4 surround the central portion in a circular ring shape while being spaced apart from each other at a regular interval. A diameter of the circular ring shape formed by arranging the eight gas supply units 4 is preferably about 150 mm or less, e.g., about 100 mm in the present embodiment. A distance d from the inner wall surface of the gas diffusion space 50 to the circular ring shape is set within a range from about 50 mm to 100 mm. The number of the gas supply units 4 provided in the gas diffusion space 50 is not limited to nine. If at least two, and preferably three or more gas supply units 4 are arranged in a circular ring shape about the center of the shower head 5 while being spaced apart from each other, the gas can be uniformly supplied into the shower head 5 in a short period of time. The gas supply units 4 are not necessarily arranged in a circular ring shape and may be arranged in a square ring shape, for example.

Figure 4:
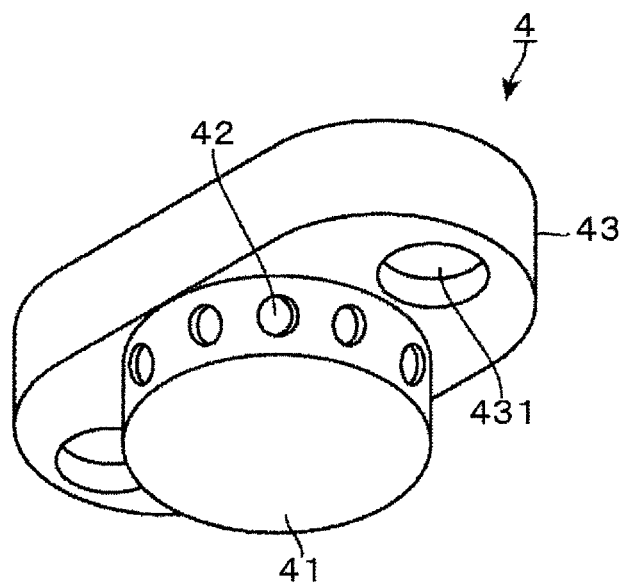
FIG. 4 is a perspective view of a gas supply unit provided at the ceiling plate.
Figure 5:
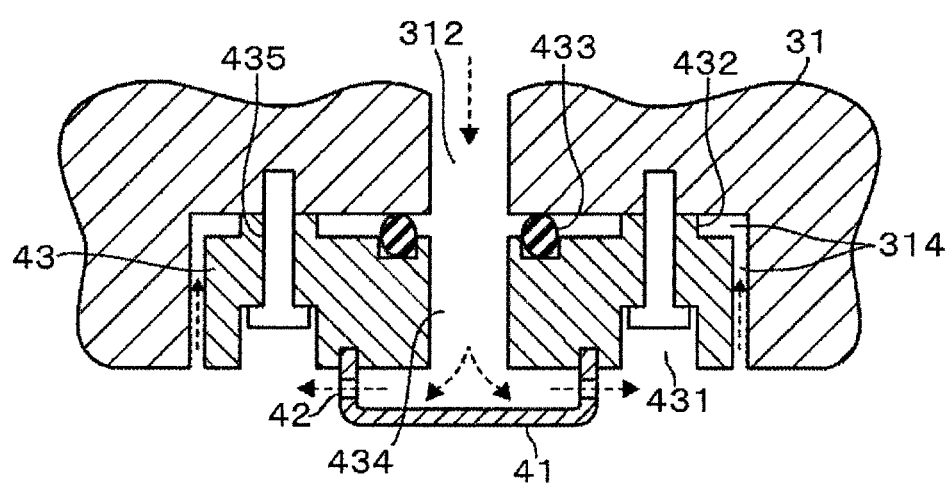
FIG. 5 is a vertical cross sectional view of the gas supply unit.

As shown in FIGS. 4 and 5, each of the gas supply units 4 includes: a pedestal portion 43 fastened to the ceiling plate 31; and a hollow head portion 41 formed at a bottom surface of the pedestal portion 43. A recess into which the pedestal portion 43 is inserted is formed at a bottom surface of the ceiling plate 31. When the pedestal portion 43 is inserted into the recess, the head portion 41 protrudes from the bottom surface of the ceiling plate 31 into the gas diffusion space 50.

Screw holes 431 are formed at the pedestal portion 43. By driving screws 435 into the screw holes 431 and screw holes formed at the recess of the ceiling plate 31, the pedestal portion 43 is fastened to the ceiling plate 31.

The reactant gases enter a space between the pedestal portion 43 and the ceiling plate 31, which results in film formation. If the pedestal portion 43 and the ceiling plate 31 are fixed to each other, particles may be generated during separation of the gas supply units 4 or the like. Therefore, the pedestal portion 43 of the present embodiment is configured to prevent such generation of particles.

As shown in FIG. 5, the pedestal portion 43 is slightly smaller than the recess of the ceiling plate 31, and a gap 314 of, e.g., about 0.1 mm to 1 mm, is formed between the outer peripheral surface of the pedestal portion 43 and the inner peripheral surface of the recess of the ceiling plate 31. A flat ring-shaped protrusion 432 protrudes upward from upper end portions of the screw holes 431 formed at the pedestal portion 43. The pedestal portion 43 is brought into contact with the ceiling plate 31 via the contact surface on the top surface of the protrusion 432. A gap 314 having the substantially same size as that formed at the side surface is formed between the top surface of the pedestal portion 43 and the bottom surface of the recess of the ceiling plate 31.

A gas path 434 communicating with a gas supply line 312 formed in the ceiling plate 31 which will be described later penetrates through the pedestal portion 43 in a vertical direction. An O-ring 433 that is a packing member for airtightly connecting the gas supply line 312 and the gas path 434 is provided around an upper opening of the gas path 434.

As a result, the pedestal portion 43 is made to contact with the ceiling plate 31 only through the O-ring 433 and the top surface of the protrusion 432. At the other portions, a comparatively large gap 314 is formed between the pedestal portion 43 and the ceiling plate 31. Therefore, even if a film is formed by the reactant gases and a cleaning gas entering the space between the pedestal portion 43 and the ceiling plate 31, the pedestal portion 43 and the ceiling plate 31 are hardly fixed to each other. Accordingly, the generation of particles during the separation of the gas supply unit 4 or the like can be suppressed.

The pedestal portion 43 is made to contact with the ceiling plate 31 other only through the O-ring 433 and the top surface of the protrusion 432. The contact portions are provided at the top surface side of the pedestal portion 43 which is separated from the position where the reactant gases enter. Therefore, it is difficult for the reactant gases to enter the space between the O-ring 433 and the ceiling plate 31 or between the contact surface of the protrusion 432 and the ceiling plate 31. Even if the reactant gases enter such a space, the generation of particles during the separation of the gas supply units 4 or the like can be suppressed because such a space is small.

The head portion 41 is a flat cylindrical cover having a diameter of about 8 mm to 20 mm, e.g., 20 mm, that covers the lower opening of the gas path 434 from the bottom surface side of the pedestal portion 43. A plurality of gas discharge openings 42 spaced apart from each other at a regular interval along the circumferential direction is formed at the side surface of the head portion 41. It is preferable to provide three or more gas discharge openings 42, e.g., twelve gas discharge openings 42 in the present embodiment, at the head portion 41. The gas discharge openings 42 are not formed in the bottom surface of the head portion 41. Therefore, the gas flowing into the head portion 41 is uniformly discharged in a horizontal direction through the gas discharge openings 42.

As described above, the gas supply units 4 are configured to uniformly supply a gas in a circumferential direction. Since the gas discharged through the gas discharge openings 42 of the gas supply units 4 is sufficiently diffused into the shower head 5 and then supplied into the processing space 313 through the gas supply openings 511, the gas is uniformly supplied to the surface of the wafer W on the mounting table 2.

Further, the discharging direction of the gas can be controlled by allowing the installation angle of the gas supply unit 4 to be controlled. Accordingly, it is possible to obtain a desired distribution of the film thickness of the wafer by controlling the flow of the gas.

As shown in FIGS. 1 and 2, gas supply lines 312 for supplying gases to the gas supply units 4 are formed at the ceiling plate 31 where the gas supply units 4 are provided. The gas supply lines 312 are connected to a gas diffusion space 311 defined between the ceiling plate 31 and the bottom surface of the holding plate 32.

The holding plate 32 has an ammonia supply line 321 for supplying ammonia gas and nitrogen gas for replacement to the gas diffusion space 311, and a titanium chloride supply line 322 for supplying titanium chloride gas and nitrogen gas for replacement to the gas diffusion space 311. The ammonia supply line 321 and the titanium chloride supply line 322 are respectively connected to an ammonia gas supply source 62 and a titanium chloride gas supply source 64 through lines. Each of the lines is branched and connected to a nitrogen gas supply source 61 or 63. Each line is provided with an opening/closing valve 602 for allowing and stopping gas supply and a flow rate control unit 601 for controlling a gas supply amount. Although the nitrogen gas supply sources 61 and 63 are separately illustrated in FIG. 1 for convenience, a common nitrogen supply source may be used instead.

The film forming apparatus configured as described above is connected to a control unit 7 as shown in FIGS. 1 and 2. The control unit 7 includes a computer having, e.g., a CPU and a storage unit (both not shown). The storage unit stores therein a program including the operation of the film forming apparatus, i.e., control steps (commands) of raising the wafer W mounted on the mounting table 2 to the processing position, forming a TiN film by supplying reactant gases and a replacement gas into the processing space 313 in a predetermined sequence, and unloading of the wafer W that has been subjected to the film formation. This program is stored in a storage medium, e.g., a hard disk, a compact disk, a magnetoptical disk, a memory card or the like, and installed in a computer.

Next, the operation of the film forming apparatus will be described with reference to FIGS. 7 and 8. First, a pressure in the processing chamber 1 is decreased to a vacuum level and, then, the mounting table 2 is lowered to the transfer position. The gate valve 12 opens and a transfer arm of the wafer transfer unit provided in the vacuum transfer chamber connected to the loading/unloading port 11 is allowed to enter the processing chamber 1 to transfer the wafer W to the supporting pins 25. Thereafter, the supports pins 25 are lowered and the wafer W is mounted on the mounting table 2 heated to the film formation temperature by the heater 21.

Next, the gate valve 12 is closed and the mounting table 2 is raised to the processing position. Then, a pressure in the processing chamber 1 is adjusted and a titanium chloride gas is supplied from a titanium chloride gas supply source 64 (see FIG. 7). The supplied titanium chloride gas flows into the gas supply units 4 through a titanium chloride supply line 322, the gas diffusion space 311 and the gas supply lines 312.

The titanium chloride gas flowing into the gas supply units 4 is introduced into the gas diffusion space 50 of the shower head 5 through the gas discharge openings 42 and supplied into the processing space 313 through the gas supply openings 511 formed at the gas supply region 51.

The titanium chloride gas supplied through the gas supply openings 511 moves downward in the processing space 313 and reaches the wafer W on the mounting table 2. A part of the titanium chloride gas is adsorbed onto the wafer W. A part of the residual titanium chloride gas is diffused along the surface of the wafer W radially in a diametric direction while being adsorbed onto the surface of the wafer W.

The titanium chloride gas that has reached the gap between the lower end of the annular protrusion 53 and the cover member 22 after flowing in the processing space 313 is discharged out of the processing space 313 through the gap and then exhausted to the outside through the gas exhaust duct 13.

In the above gas flow, pressure loss that occurs when the gas flows from the processing space 313 toward the gas exhaust duct 13 is controlled by providing an annular protrusion 53 at a peripheral portion of the shower head 5 and properly setting a height of the gap between the mounting table 2 (cover member 22) and the annular protrusion 53. As a result, the reactant gases stay in the processing space 313 for a period of time which is long enough to be absorbed onto wafer W and then are uniformly discharged toward the peripheral outer side where the gap is formed.

Figure 7:
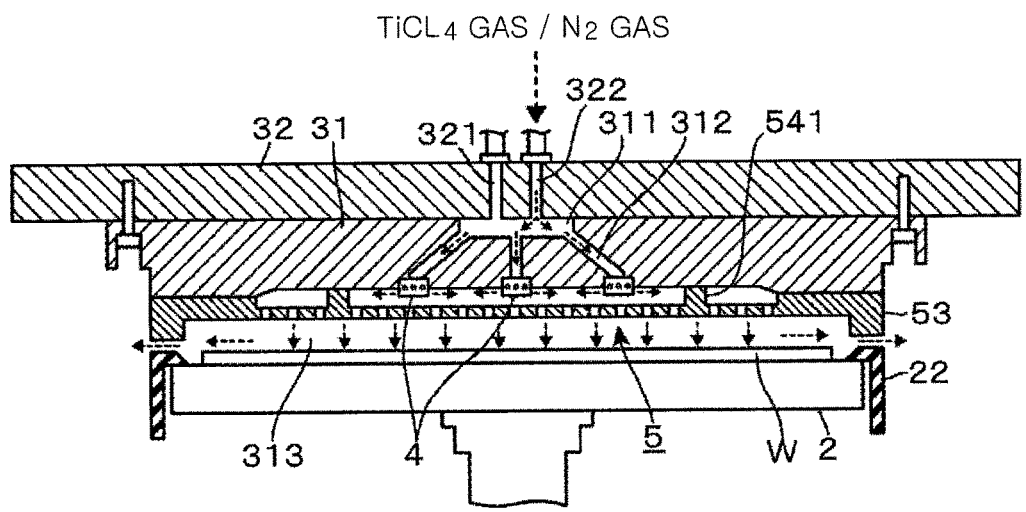
FIG. 7 is a first explanatory view showing an operation of the film forming apparatus.

Next, the supply of titanium chloride gas is stopped and nitrogen gas as a replacement gas is supplied from the nitrogen gas supply source 63 (see FIG. 7). The nitrogen gas is supplied into the processing space 313 in the same route as that of the titanium chloride gas. The titanium chloride gas existing in the above route and the processing space 313 is replaced with the nitrogen gas.

Figure 8:
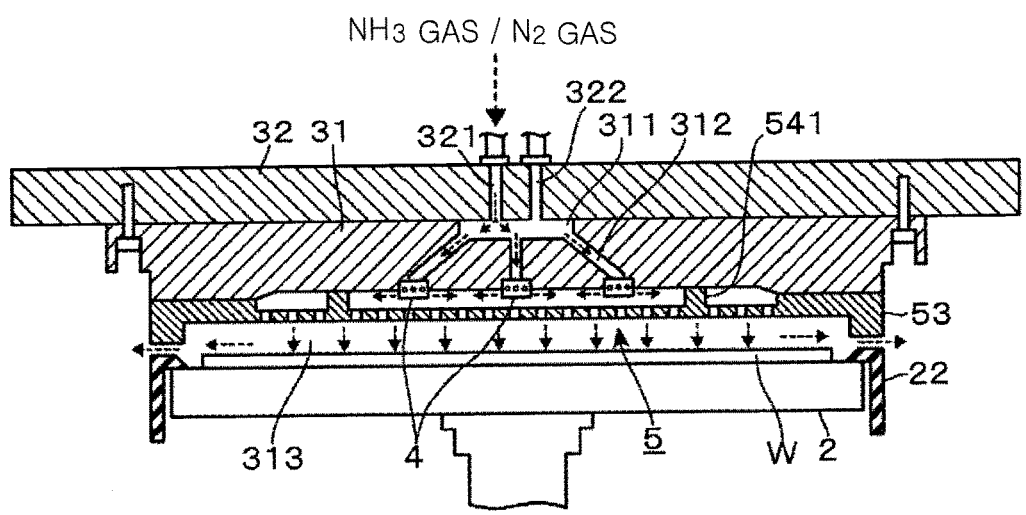
FIG. 8 is a second explanatory view showing the operation of the film forming apparatus.

After the nitrogen gas is supplied for a predetermined period of time and the replacement of gas is carried out, the supply of the nitrogen gas is stopped and ammonia gas is supplied from the ammonia gas supply source 62 (see FIG. 8). The supplied ammonia gas flows into the gas supply units 4 via the ammonia supply line 321, the gas diffusion space 311 and the gas supply lines 312. The ammonia gas discharged from the gas supply units 4 into the shower head 5 flows in the same route as that of the titanium chloride and then is supplied into the processing space 313.

When the ammonia gas flowing in the processing space 313 reaches the surface of the wafer W, the component of the titanium chloride gas adsorbed onto the wafer W is nitrided to generate titanium nitride. Thereafter, the gas supplied to the gas supply lines 312 is switched to nitrogen gas for replacement from the nitrogen gas supply source 61 and the ammonia gas existing in the supply route of the ammonia gas and the processing space 313 is replaced with nitrogen gas (see FIG. 8).

By supplying the reactant gases (titanium chloride gas and ammonia gas) and the replacement gas (nitrogen gas) in the order of titanium chloride gas, nitrogen gas, ammonia gas and nitrogen gas, a molecular layer of titanium nitride (TiN) is laminated on the surface of the wafer W. Accordingly, a titanium nitride film is formed on the surface of the wafer W.

Hereinafter, the operations of the gas supply units 4 and the shower head 5 during the supply of the reactant gases and the replacement gas will be described. First, the gas supplied to the gas supply units 4 through the gas supply lines 312 is discharged to the space in the shower head 5 while being diffused in a horizontal direction from the gas discharge openings 42 spaced apart from each other at a regular interval along the circumferential direction of the head portion 41. The gas discharged from the gas discharge openings 42 flows downward in the shower head 5 and reaches the gas diffusion space 50. The gas in the gas diffusion space 50 is uniformly supplied into the processing space 313 through the gas supply openings 511 (see FIGS. 6 to 8).

The flow velocity of the gas discharged from the gas supply unit 4 is sufficiently decreased in the shower head 5. The gas having a decreased flow velocity is distributed to the processing space 313 through the gas supply openings 511. Therefore, the flow velocity of the reactant gas (titanium chloride gas or ammonia gas) discharged from the gas supply openings 511 is decreased. As a result, the reactant gas reaches the surface of the wafer W at a decreased flow velocity and the in-plane uniformity of the film thickness is improved.

In the case of supplying the replacement gas (nitrogen gas), if a small-sized shower head 5 in which the area of the gas diffusion space 50 seen from the bottom side is smaller than that of the wafer W is used, a period of time required for the gas replacement can become short due to a small volume of the shower head 5.

The reactant gases used for ALD have different fluidities. For example, titanium chloride is easily diffused even in a narrow flow path whereas ammonia gas is not easily diffused compared to titanium chloride. Since the bottom surface of the shower head 5 facing the wafer W on the mounting table 2 is flat and the distance from the top surface of the wafer W to the bottom surface of the shower head 5 is uniform, the reactant gases can be uniformly diffused, regardless of different fluidities, to the processing space 313 having a uniform height. As a result, the in-plane uniformity of the thickness of the film formed on the wafer W can be improved.

The bottom surface of the shower head 5 is heated by the heater 324 provided on the top surface of the holding plate 32 and also by radiant heat from the wafer W heated by the heater 21 provided at the mounting table 2. Therefore, the reaction of the reactant gases on the surface of the wafer W is affected by the temperature state of the shower head 5 as well as the heating of the heater 21.

Since the distance from the top surface of the wafer W and the bottom surface of the shower head 5 is uniform as described above, the effect of the heat transferred from the shower head 5 to the wafer W is uniform over the surface of the wafer W. Accordingly, the characteristics of the film (e.g., resistivity to be described later) are uniform over the surface of the wafer W. Further, since the heat transfer members 54 for facilitating heat transfer are distributed in the gas diffusion space 50 of the shower head 5 as described above, the temperature distribution of the bottom surface of the shower head 5 becomes further uniform. Hence, the effect of the heat on the wafer W can become uniform over the surface of the wafer W.

After the titanium nitride film of a desired thickness is formed by repeating the supply of titanium chloride gas and the supply of ammonia gas several tens to several hundreds of times, for example, nitrogen gas for replacement is supplied to discharge the remaining ammonia gas and the mounting table 2 is lowered to the transfer position. Then, the gate valve 12 opens and the transfer arm is allowed to enter the processing chamber 11 to receive the wafer W from the supporting pins 25 in the reverse sequence of the loading process. Next, the wafer W that has been subjected to the film formation is unloaded and, then, loading of a next wafer W is prepared.

The film forming apparatus of the present embodiment provides the following effect. Since the shower head 5 having the gas diffusion space 50 smaller than the wafer W as a film formation target is used and a plurality of gas supply units 4 is provided inside the shower head 5, the reactant gases and the replacement gas can be replaced in a short period of time. The gas discharge openings 42 are formed at each of the gas supply units 4 along the circumferential direction thereof such that the gas is diffused in a horizontal direction. The reactant gas is injected through the gas supply openings 511 formed at the bottom surface of the shower head 5 after its flow direction is changed. Accordingly, the reactant gas is uniformly supplied from the entire surface of the shower head and the in-plane uniformity of the thickness of the film formed on the wafer W can be improved.

The arrangement of the gas supply units 4 in the shower head 5 is not limited to the example shown in FIG. 5 in which one gas supply unit 4 is provided at the central portion and a plurality of gas supply units 4 surround the central gas supply unit 4 in a circular ring shape. For example, the gas supply units 4 may be arranged in a lattice shape.

By allowing the lower end portion of each gas supply unit 4 to penetrate through the shower head 5 from the bottom surface thereof such that the shower head 5 is supported by the gas supply units 4, the height of the diffusion space 50 is further reduced. Accordingly, the efficiency of the replacement of the reactant gases can be improved.

The shape of the gas discharge openings 42 formed at the head portion 41 of the gas supply unit 4 is not limited to that shown in FIG. 4. For example, a single slit extending along a circumferential direction of a side surface of the head portion 41 may be formed and covered by a mesh-shaped member. Further, it is not necessary to form the head portion 41 at the gas supply unit 4. For example, a spiral-shaped flow path or the like may form the gas supply line 312 such that the gas is discharged from the gas supply line 312 into the shower head 5 while forming a vortex flow. In that case, the gas discharged while forming the vortex flow is diffused in a horizontal direction into the shower head 5. After the flow velocity of the gas is decreased, the gas is uniformly supplied to the processing space 313 through the gas supply openings 511.

In the film forming apparatus of the present embodiment, it is possible to form, other than the TiN film, a film containing a metal element, e.g., a third periodic element in the periodic table such as Al, Si or the like, a fourth periodic element in the periodic table such as Ti, Cr, Mn, Fe, Co, Ni, Cu, Zn, Ge or the like as, a fifth periodic element in the periodic table such as Zr, Mo, Ru, Rh, Pd, Ag or the like, or a sixth period element in the period table such as Ba, Hf, Ta, W, Re, Ir, Pt or the like. An organic or an inorganic metal compound of such metal elements may be used as the reactant gas (source gas). As for a metal source to be adsorbed into the surface of the wafer W, there may be used, e.g., BTBAS (Bis tertiarybutylamino Silane), DCS (dichlorosilane), HCD (hexachlorodisilane), TMA (Trimethyl Aluminum), 3DMAS (Tris dimethylaminosilane) or the like other than $TiCl_4$.

As for the reaction that allows a desired film to be formed by reacting the source gas adsorbed onto the surface of the wafer W, there may be used various reactions, e.g., oxidation reaction using $O_2$, $O_3$, $H_2O$ or the like, reduction reaction using organic acid such as $H_2$, HCOOH, $CH_3COOH$ or the like and alcohols such as $CH_3OH$, $C_2H_5OH$ or the like, carbonization reaction using $CH_4$, $C_2H_6$, $C_2H_4$, $C_2H_2$ or the like, nitriding reaction using $NH_3$, $NH_2NH_2$, $N_2$ or the like.

As for the reactant gases, three or four types of reactant gases may be used. For example, in the case of using three types of reactant gases, strontium titanium oxide ($SrTiO_3$) may be formed. For example, a Sr source, e.g., $Sr(THD)_2$ (Strontium tetramethylheptanedionate), a Ti source, e.g., $Ti(OiPr)_2(THD)_2$ (titanium bis isoproxide bis tetramethylheptanedionate), and an ozone gas as an oxidizing gas are used. In that case, the gases are switched in the order of a Sr source gas, a replacement gas, an oxidizing gas, a replacement gas, a Ti source gas, a replacement gas, an oxidizing gas and a replacement gas. Although a circular wafer W has been described as a substrate to which film formation is performed, the present invention may also be applied to a rectangular glass substrate (substrate for use in LCD).

TEST EXAMPLES (Test 1)
A TiN film was formed by using an ALD method that alternately supplies a titanium chloride gas and an ammonia gas to a wafer by different film forming apparatuses and, then, characteristics of the TiN film were examined.

A. Test Conditions

Test Example 1-1

A resistivity (sheet resistance) and a film thickness of the formed TiN film were measured by performing 182 cycles of alternately supplying reactant gases and a replacement gas in the order of titanium chloride gas, nitrogen gas, ammonia gas and nitrogen gas by a film forming apparatus configured as described in FIGS. 1 to 6. A heating temperature of the wafer W was set to 440° C.

Reference Example 1-1

Figure 9:
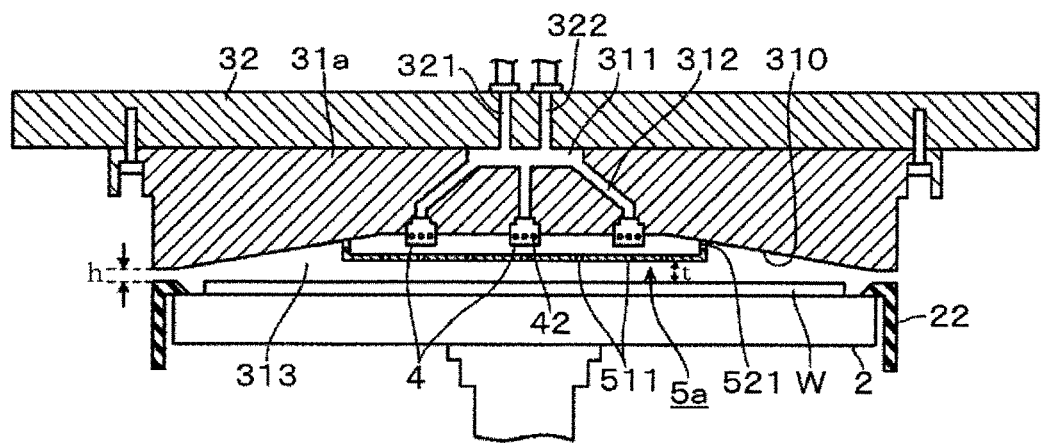
FIG. 9 is a partially enlarged vertical cross sectional view of a film forming apparatus of a reference example.

A TiN film was formed under the same conditions of the test example 1-1 by using the film forming apparatus shown in FIG. 9. Hereinafter, the film forming apparatus shown in FIG. 9 will be described. A shower head 5a having a diameter of 200 mm is provided at a central portion of a ceiling plate 31a having an inclined surface 310 that becomes gradually wider from a central side toward the peripheral side. Further, eight gas supply units 4a, each having gas discharge openings 42, are arranged inside the shower head 5a as in the example shown in FIG. 6. A central gas supply unit 4a has a diameter of 15 mm and the gas supply units 4a arranged in a circular ring shape have a diameter of 10 mm. A circular ring shape formed by arranging eight gas supply units 4a has a diameter of 100 mm. The gas is supplied into the processing space 313 through the gas supply openings 521 formed at the side surface as well as at the bottom surface of the shower head 5a. In FIG. 9, like reference numerals refer to like parts of the film forming apparatus shown in FIGS. 1 to 6.

B. Test Result

Figure 10:
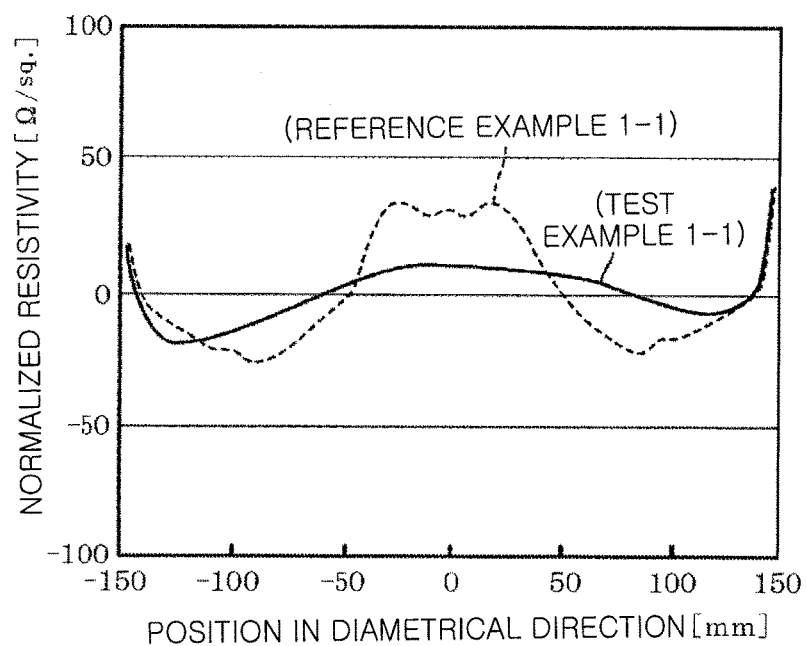
FIG. 10 is an explanatory view showing a resistivity of a film in a test example and the reference example.
Figure 11:
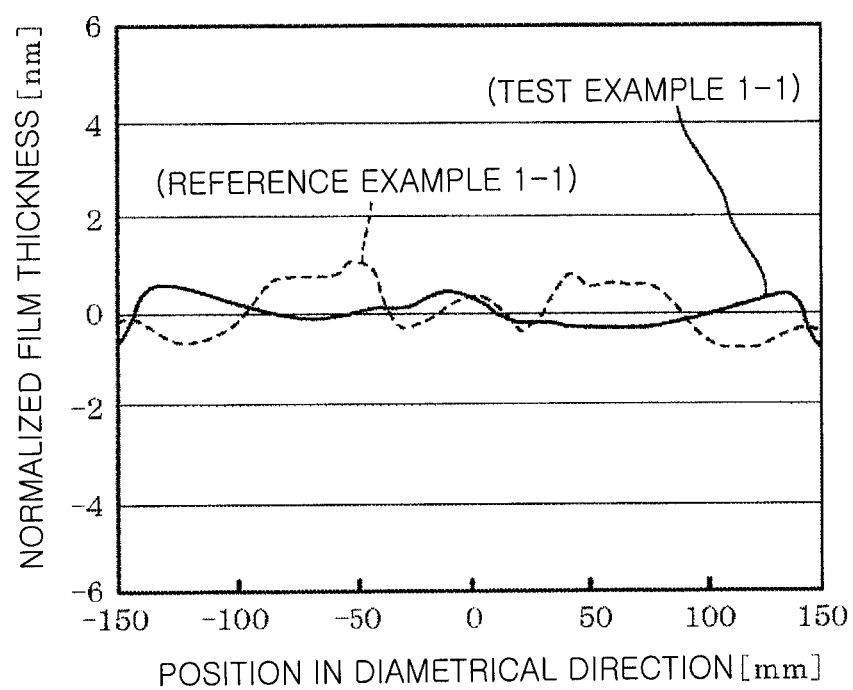
FIG. 11 is an explanatory view showing a thickness of a film in the test example and the reference example.

FIG. 10 shows in-plane distribution of normalized resistivity. FIG. 11 shows distribution of normalized film thickness. In FIGS. 10 and 11, the horizontal axis represents a position in a diametrical direction and the vertical axis represents normalized resistivity or film thickness in each position. In FIGS. 10 and 11, solid lines show the result of the test example 1-1 and dotted lines show the result of the reference example 1-1. The normalized data is obtained by subtracting from the measured resistivity and the measured thickness the averages thereof over the surface of the wafer W.

As shown in FIG. 10, the resistivity of the TiN film formed on the wafer W is high at the central portion of the wafer W and low at the peripheral portion of the wafer W in the test example 1-1, and the in-plane uniformity of the resistivity is improved in the test example 1-1 compared to the reference example 1-1. Further, a value of uniformity expressed by "(standard deviation σ)/(average Ave)×100" is 5.3[%] in the reference example 1-1 and 2.6[%] in the test example 1-1, which means that the improved in-plane uniformity is obtained in the test example 1-1.

As shown in FIG. 11, the film thickness is large around the central portion of the wafer W and small at the peripheral portion thereof, and the in-plane uniformity of the film thickness is improved in the test example 1-1 compared to the reference example 1-1. A value of uniformity is 1.2[%] in the reference example 1-1 and 1.6[%] in the test example 1-1. Although both are smaller than or equal to 2%, the increase/decrease of the film thickness over the surface is small and device characteristics are hardly affected in the test example 1-1.

The reason because the in-plane uniformity of the resistivity or the film thickness is improved in the film forming apparatus of the test example compared to the film forming apparatus of the reference example shown in FIG. 9 may be that the uniformity of the fluidity of the reactant gas or the heating state of the wafer W is improved in the case of using the ceiling plate having a flat bottom surface compared to the case of using the ceiling plate 31a having the inclined surface 310.

(Test 2)
The efficiency of the replacement was compared between the shower heads 5 and 5a of the film forming apparatuses in the test example and the reference example of the test 1.

A. Test Conditions
In the test example 1-1, nitrogen gas for replacement was supplied for 0.5 sec between the supply of titanium chloride gas and the supply of ammonia gas. In the Reference Example 1-1, nitrogen gas was supplied for 0.3 sec at the same flow rate as that in the test example 1-1.

Comparative Example 2-1

The film formation was performed under the same conditions as those of the test example 1-1 except that nitrogen gas was supplied for 0.3 sec.

Figure 12:
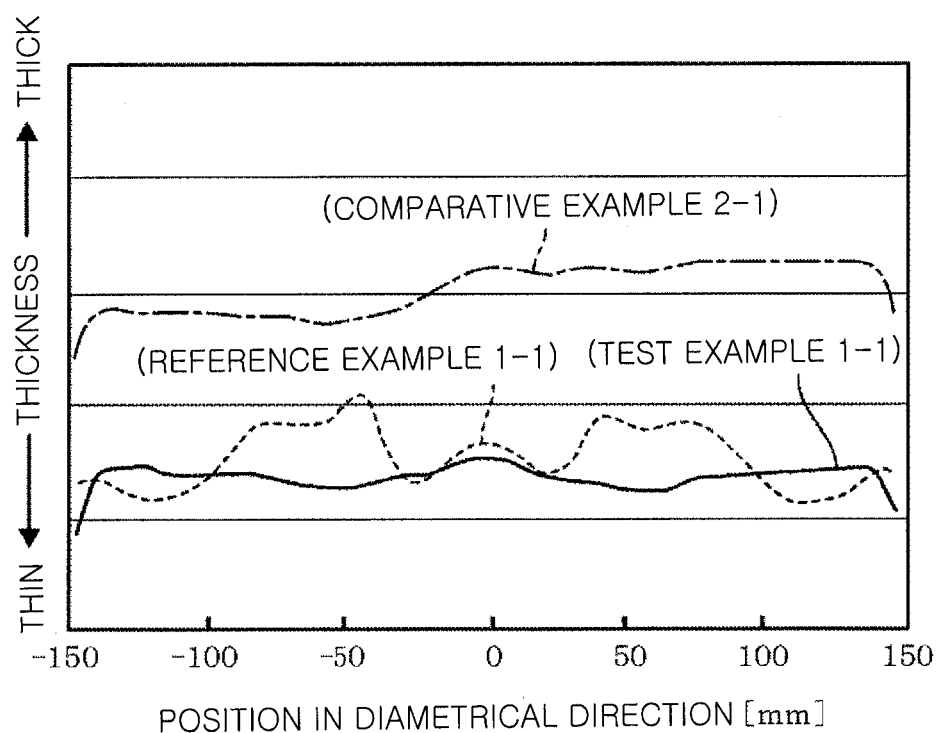
FIG. 12 is an explanatory view showing variation of a film thickness in the case of varying a temperature of a mounting table and a supply time of a replacement gas.

B. Test Result
FIG. 12 shows thickness distribution of TiN films formed in the test example 1-1, the reference example 1-1, and the comparative example 2-1. The horizontal axis represents a position in a diametrical direction of the wafer W and the vertical axis represents a film thickness in each position. In FIG. 12, the test example 1-1 is indicated by a solid line; the reference example 1-1 is indicated by a dotted line; and the comparative example 2-1 is indicated by a dashed dotted line.

According to the result of the comparative example 2-1 shown in FIG. 12, the film thickness of the TiN film is considerably increased when the supply time of nitrogen gas is reduced to 0.3 as in the case of the reference example 1-1. This is because, in the shower head 5 (see FIG. 2) having the gas diffusion space 50 having a larger volume compared to that of the shower head 5a shown in FIG. 9, if the supply time of nitrogen gas is short, the replacement of the reactant gas is not sufficient and this promotes CVD (Chemical Vapor Deposition) reaction in the processing space 313.

Meanwhile, when the supply time of nitrogen gas is increased to 0.5 sec as in the case of the test example 1-1, it is possible to realize ALD reaction capable of forming a TiN film having an average film thickness substantially the same as that in the reference example 1-1. If the supply time of nitrogen gas is increased to 0.5 sec, a period of time required for forming a film on a single wafer W is increased. Since, however, the operation of the apparatus is not affected, it is considered practical.

(Test 3)

The effect of thermal budget in the case of processing a plurality of wafers W by using the film forming apparatus shown in FIGS. 1 to 6 was examined.

A. Test Conditions

Preliminary Test 3-1

Temperature variation at the bottom surface of the shower head 5 was examined while varying the temperature of the heater 21 provided at the mounting table 2 on which the wafer W is mounted. The temperature of the heater 324 provided at the ceiling plate 31 was fixed to 175° C.

Test Example 3-1

In-plane variation of the resistivity in the case of processing 1000 wafers W under the conditions same as those of the test example 1-1 were examined.

B. Test Result

Figure 13:
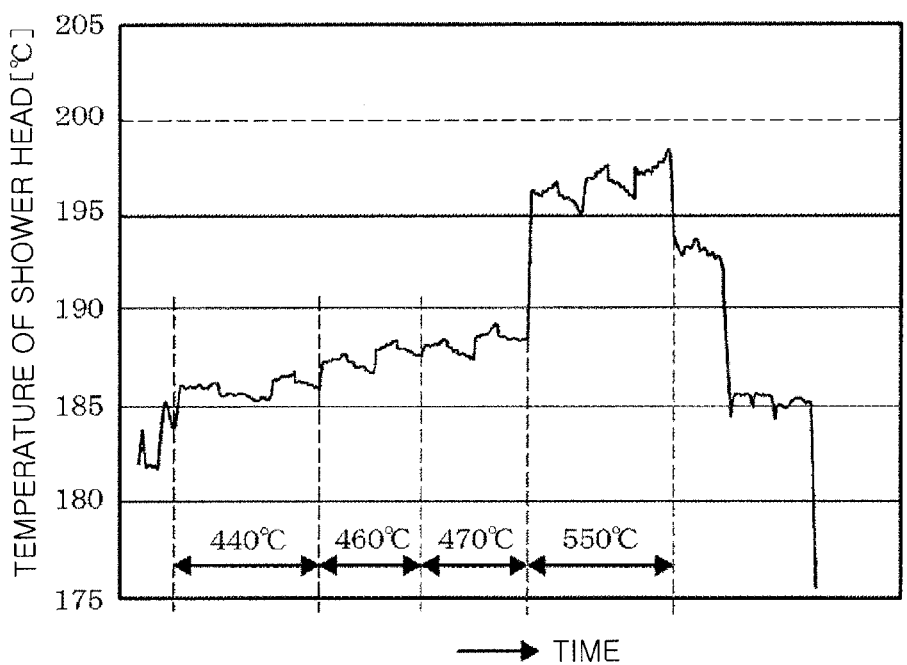
FIG. 13 is an explanatory view showing temporal variation of a temperature of a shower head in response to variation of a set temperature of the mounting table.

FIG. 13 shows the result of the preliminary test 3-1. In FIG. 13, the horizontal axis represents time and the vertical axis represents maximum temperatures measured at multiple locations of the shower head 5. In FIG. 13, a set temperature of the heater 21 and a set period thereof are shown.

According to the result shown in FIG. 13, even when the temperature of the heater 21 provided at the mounting table 2 is increased to 550° C., the temperature of the bottom surface of the shower head 5 can be suppressed to 200° C. or less at which an abnormal value of the TiN film is monitored.

Figure 14:
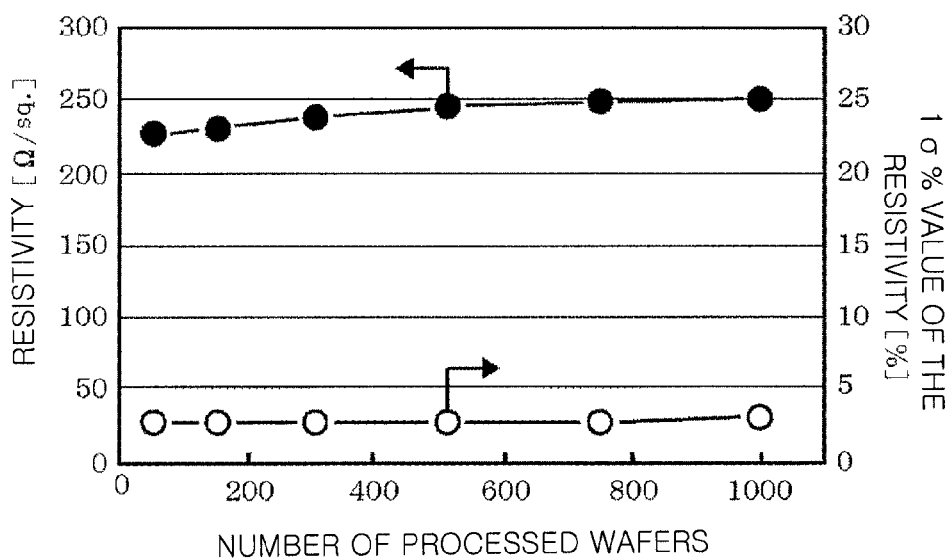
FIG. 14 is an explanatory view showing in-plane variation of a resistivity of a film in the case of processing a plurality of wafers.

FIG. 14 shows variation of resistivity of the TiN film in the case of processing 1000 wafers W under the same conditions as those of the test example 1-1. In FIG. 14, the horizontal axis represents the number of processed wafers W; the left vertical axis represents average of the resistivity over the surface; and the right vertical axis represents 1σ % value of the resistivity. In FIG. 14, the average of the resistivity is plotted by black circles and the 1σ % value is plotted by white circles.

According to the result shown in FIG. 14, the average of the resistivity tends to be gradually increased as the number of processed wafers W is increased. This is because as the number of processed wafers W is increased, the temperature of the shower head 5 is increased by the thermal budget and this results in the increase of the speed of film formation. Meanwhile, 1σ % value indicating the in-plane uniformity is considered to be substantially constant. This indicates that the film formation can be uniformly and stably performed over the surface of the wafer W by using the shower head 5 having the flat bottom surface regardless of the increase in the number of processed wafers W (the increase in the temperature of the shower head 5).

(Test 4)

The effect of the difference in the diameters of the gas supply units 4 and 4a on the gas diffusion state was simulated.

A. Test Conditions

Test Example 4-1

The gas diffusion state in the gas diffusion space 50 of the shower head 5 shown in FIGS. 1 and 2 was simulated. The diameter of the gas supply units 4 was set to about 19 mm.

Reference Example 4-1

The gas diffusion state in the shower head 5a of the shower head 5a shown in FIG. 9 was simulated. The diameter of the gas supply units 4a surrounding the gas supply unit 4a provided at the central portion was set to about 8 mm.

Figure 15A:
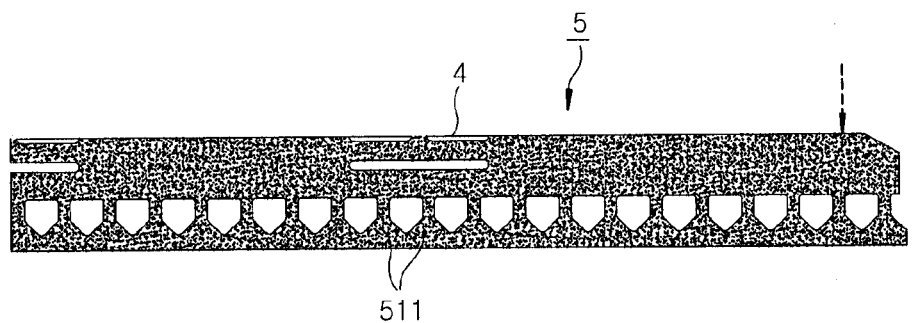
FIGS. 15A and 15B are explanatory views showing gas diffusion states in shower heads of a test example and a reference example.
Figure 15B:
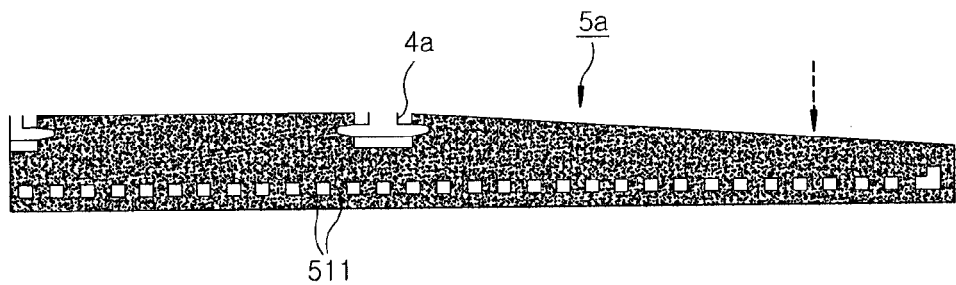

FIG. 15A shows the simulation result of the test example 4-1. FIG. 15B shows the simulation result of the reference example 4-1. Dotted arrows in the drawings indicate portions of the shower heads 5 and 5a (gas diffusion space 50) where gases discharged from the gas supply units 4 and 4a reach.

According to the simulation results shown in FIGS. 15A and 15B, the gas supply unit 4 having a larger diameter can uniformly distribute the gas in the shower head 5. According to another simulation of gas flow near the gas supply units 4 and 4a, in the case of the gas supply unit 4 having a large diameter, a horizontal vector of the gas supplied from the gas supply unit 4 is relatively greater and the gas can be uniformly supplied to a wider area in the diffusion space 50. Since the gas can be uniformly diffused into the shower head 5 (gas diffusion space 50), it is possible to form a TiN film with a uniform thickness over the surface by uniformly supplying reactant gases to the surface of the wafer W as a film formation target.

While the invention has been shown and described with respect to the embodiments, it will be understood by those skilled in the art that various changes and modifications may be made without departing from the scope of the invention as defined in the following claims.

What is claimed is:

1. A film forming apparatus for performing a film forming process by sequentially supplying a plurality of reactant gases to a substrate in a processing chamber in a vacuum atmosphere and by supplying a replacement gas between supply of one reactant gas and supply of a next reactant gas, the film forming apparatus comprising:
   a mounting table provided in the processing chamber and configured to mount the substrate thereon;
   a shower head including an annular protrusion protruding downward, the annular protrusion being configured to provide a gap distance between the annular protrusion and a peripheral top surface of the mounting table provided at an outer side of a substrate mounting region of the mounting table;
   a plurality of gas supply units disposed at a ceiling portion, wherein the ceiling portion is located at an upper side of the shower head, wherein each of the plurality of gas supply units includes gas discharge openings formed along a circumferential direction thereof, wherein the gas discharge openings are configured to discharge a gas to a diffusion space that is surrounded by the shower head and the ceiling portion, wherein a top surface of the shower head is attached to a bottom surface of the ceiling portion; and a gas exhaust unit configured to evacuate the processing chamber, wherein each of the gas supply units includes:

a pedestal portion comprising a gas path formed therein and protrusions protruding upwards, wherein a packing member is provided between the pedestal portion and the ceiling portion to render the gas path to airtightly communicate with a gas supply line formed in the ceiling portion and the pedestal portion is fixed to the ceiling portion through the protrusions by screws; and a head portion comprising a space configured to allow a gas flowing from the gas path to diffuse therein, wherein the head portion has the gas discharge openings at a side peripheral surface thereof, wherein the pedestal portion is inserted into a recess formed at the bottom surface of the ceiling portion such that the head portion is protruded from the bottom surface of the ceiling portion, wherein the pedestal portion is smaller than the recess of the ceiling portion such that a gap is formed between an outer peripheral surface of the pedestal portion and an inner peripheral surface of the recess of the ceiling portion, and wherein the pedestal portion is in direct contact with the ceiling portion only through the packing member and a top surface of each of the protrusions.

2. The film forming apparatus of claim 1, wherein the gas discharge openings are disposed at positions that allow a gas to be diffused toward a central portion and a peripheral portion of the shower head in a plan view.

3. The film forming apparatus of claim 1, wherein the gas supply units are disposed at three or more positions spaced apart from each other in a circular ring shape about a center of the shower head.

4. The film forming apparatus of claim 1, further comprising:

a temperature control unit configured to control a temperature of the shower head via the ceiling portion; and a heat transfer member disposed in the diffusion space and couples the shower head and the ceiling portion, wherein the heat transfer member is configured to facilitate heat transfer between the shower head and the ceiling portion, wherein the shower head and the ceiling portion are separate members.

5. The film forming apparatus of claim 1, wherein the substrate is a circular plate, wherein the diffusion space has a circular shape in a plan view, and wherein a ratio of a radius of the diffusion space to a radius of the circular plate is within a range from about 4/15 to 9/10.

6. The film forming apparatus of claim 1, wherein the head portion has a cylindrical shape and a diameter thereof ranges from about 8 mm to 20 mm.

7. The film forming apparatus of claim 1, wherein the shower head further includes: a gas supply region, wherein the gas supply openings are formed in the gas supply region; and a peripheral region surrounding the gas supply region, wherein no gas supply opening is formed in the peripheral region, wherein the annular protrusion protrudes downward from the peripheral region, and wherein an outer periphery of the diffusion space is located at an inner side of an outer periphery of the substrate mounted on the mounting table in a plan view.

8. The film forming apparatus of claim 7, wherein the gas supply region and the peripheral region flush with each other.

9. The film forming apparatus of claim 1, further comprising:

a cover member disposed at the mounting table to cover the peripheral top surface and a peripheral side surface of the mounting table, wherein an upper end portion of the cover member is inwardly bent in a horizontal direction to be fixed to the peripheral top surface of the mounting table, and wherein a lower end of the annular protrusion is disposed directly above the upper end portion of the cover member.

10. A film forming apparatus for performing a film forming process by sequentially supplying a plurality of reactant gases to a substrate in a processing chamber in a vacuum atmosphere and supplying a replacement gas between supply of one reactant gas and supply of a next reactant gas, the film forming apparatus comprising:

a mounting table provided in the processing chamber and configured to mount thereon the substrate;

a cover member provided at the mounting table to cover a peripheral top surface of the mounting table disposed at an outer side of a substrate mounting region of the mounting table and a peripheral side surface of the mounting table, the cover member including a bent portion that is inwardly bent in a horizontal direction to be fixed to the peripheral top surface of the mounting table;

a shower head including an annular protrusion protruding downward, the annular protrusion being configured to provide a gap distance between a lower end of the annular protrusion and a top surface of the bent portion;

a plurality of gas supply units provided at a ceiling portion, wherein the ceiling portion is disposed at an upper side of the shower head, wherein each of the gas supply units includes gas discharge openings formed along a circumferential direction thereof, wherein the gas discharge openings are configured to discharge a gas to a diffusion space which is surrounded by the shower head and the ceiling portion; and a gas exhaust unit configured to evacuate the processing chamber, wherein each of the gas supply units includes:

a pedestal portion comprising a gas path formed therein and protrusions protruding upwards, wherein a packing member is provided between the pedestal portion and the ceiling portion to render the gas path to airtightly communicate with a gas supply line formed in the ceiling portion and the pedestal portion is fixed to the ceiling portion through the protrusions by screws; and a head portion comprising a space configured to allow a gas flowing from the gas path to diffuse therein, wherein the head portion has the gas discharge openings at a side peripheral surface thereof, wherein the pedestal portion is inserted into a recess formed at the bottom surface of the ceiling portion such that the head portion is protruded from the bottom surface of the ceiling portion, wherein the pedestal portion is smaller than the recess of the ceiling portion such that a gap is formed between an outer peripheral surface of the pedestal portion and an inner peripheral surface of the recess of the ceiling portion, and wherein the pedestal portion is in direct contact with the ceiling portion only through the packing member and a top surface of each of the protrusions.

11. The film forming apparatus of claim 10, wherein the gas discharge openings are provided at positions that allow a gas to be diffused toward a central portion and a peripheral portion of the shower head in a plan view.

12. The film forming apparatus of claim 10, wherein the gas supply units are disposed at three or more locations spaced apart from each other in a circular ring shape about a center of the shower head.

13. The film forming apparatus of claim 10, further comprising:

a temperature control unit configured to control a temperature of the shower head via the ceiling portion; and a heat transfer member disposed in the diffusion space and coupling the shower head and the ceiling portion, wherein the heat transfer member is configured to facilitate heat transfer between the shower head and the ceiling portion, wherein the shower head and the ceiling portion are separate members.

14. The film forming apparatus of claim 10, wherein the substrate is a circular plate; the diffusion space has a circular shape in a plan view; and a ratio of a radius of the diffusion space to a radius of the circular plate is within a range from about 4/15 to 9/10.

15. The film forming apparatus of claim 10, wherein the head portion has a cylindrical shape and a diameter thereof ranges from about 8 mm to 20 mm.

16. The film forming apparatus of claim 10, wherein the shower head further includes: a gas supply region with the gas supply openings formed therein; and a peripheral region with no gas supply opening formed therein, wherein the peripheral region surrounds the gas supply region, wherein the annular protrusion protrudes downward from the peripheral region, and wherein the diffusion space is disposed such that an outer periphery of the diffusion space is located at an inner side of an outer periphery of the substrate mounted on the mounting table in a plan view.

17. The film forming apparatus of claim 16, wherein the gas supply region and the peripheral region flush with each other.

* * * * *